United States Patent [19]

Hareyama

[11] Patent Number: 4,535,257
[45] Date of Patent: Aug. 13, 1985

[54] COMPARATOR CIRCUIT

[75] Inventor: Kyuichi Hareyama, Tokyo, Japan

[73] Assignee: Nippon Electric Co., Ltd., Tokyo, Japan

[21] Appl. No.: 424,866

[22] Filed: Sep. 28, 1982

Related U.S. Application Data

[63] Continuation of Ser. No. 127,201, Mar. 4, 1980, abandoned.

[30] Foreign Application Priority Data

Mar. 6, 1979 [JP] Japan .................................. 54-25864

[51] Int. Cl.³ ............................................ H03K 5/153
[52] U.S. Cl. .................................... 307/362; 328/150;
328/162; 340/347 AD; 340/347 M; 340/347 CC
[58] Field of Search .... 340/347 M, 347 CC, 347 AD, 340/347 C; 330/4, 253, 257; 307/251

[56] References Cited

U.S. PATENT DOCUMENTS

| | | | |
|---|---|---|---|
| 3,509,460 | 4/1970 | Mizrahi | 340/347 CC X |
| 3,739,375 | 6/1973 | Chatelon et al. | 340/347 CC |
| 3,811,125 | 5/1974 | Schumann | 340/347 CC X |
| 3,982,241 | 9/1976 | Lipcon | 340/347 CC |
| 4,047,059 | 9/1977 | Rosenthal | 307/355 |
| 4,072,938 | 2/1978 | Buchanan | 340/347 M X |
| 4,075,509 | 2/1978 | Redfern | 307/251 |
| 4,083,043 | 4/1978 | Breuer | 340/347 M X |

OTHER PUBLICATIONS

Hnatek, A User's Handbook of D/A and A/D Converters, J. Wiley & Sons, 1976, pp. 268–274.
Timco et al., 12-Bit Successive Approximation A/D Does It All With . . . , Electric Design 20, Sep. 27 '78, pp. 68–76.
The Engineering Staff of Analog Devices, Inc., Analog-Digital Conversion Handbook, 6/1972, pp. II--32,33, 46–53, 80–87.
Schmid, Electronic Analog/Digital Conversions, Van Nostrand Reinhold, 1970, pp. 240–247.
Hellwarth et al., Differential Automatic Zero-Correcting Amplifier, IBM Technical Disclosure Bulletin, vol. 15, No. 9, 2/1973, pp. 2719–2720.
Caves et al., A PCM Voice Codec with On-Chip Filters, IEEE Journal of Solid State Circuits, vol. SC-14, No. 1, 2/1979, pp. 65–73.
McCreary et al., A High-Speed, All MOS Successive-Approximation . . . , IEEE Int'l. Solid-State Circuits Conf., 2/1975, pp. 38–39.

Primary Examiner—T. J. Sloyan
Attorney, Agent, or Firm—Laff, Whitesel, Conte & Saret

[57] ABSTRACT

A comparator circuit operable at a high speed is disclosed. The comparator circuit comprises a differential amplifier having a pair of inputs, and a switch circuit arranged between the pair of inputs, wherein the switch circuit is made conductive state prior to the comparison operation to delete potential difference between the pair of inputs.

9 Claims, 10 Drawing Figures

COMPARATOR CIRCUIT

This is a continuation of application Ser. No. 127,201 filed Mar. 4, 1980, abandoned.

The present invention relates to a comparator circuit, and more particularly, to a high speed comparator circuit suitable for an analog to digital (A/D) converter.

Various types of comparator circuits in the prior art had, in many cases, a satisfactory response speed for signals fed from a low impedance signal source. However it was difficult for them to attain a satisfactory response speed in a comparison operation for signals fed from a high impedance signal source, because a large time constant was caused by the high impedance of the signal source and by a parasitic capacitance at the input section of the comparator circuit.

Therefore, it is one object of the present invention to provide a comparator circuit which can achieve a high speed operation even for signals fed from a high impedance signal source.

Another object of the present invention is to provide a comparator circuit which can be easily realized in the form of an integrated circuit device.

Yet another object of the present invention is to provide an A/D converter which is operable with high speed.

The comparator circuit according to the present invention comprises a differential amplifier, a switch connected between the differential input terminals of this amplifier, and means for applying a control signal to the switch. The switch is actuated to a closed position in response to the control signal fed from a timing circuit, at an appropriate timing so that any delay in the comparison operation which might be caused by parasitic capacitances, and the like in the signal line, may be eliminated. The control signal may be fed from an external timing circuit.

According to one aspect of the present invention, a comparator circuit comprises a differential amplifier circuit. Switching means are connected between differential input terminals of the differential amplifier circuit, and first control means for controlling opened and closed states of the switching means. The differential input terminals serves as an input for the comparator circuit, while the output of the differential amplifier circuit, when the switching means is open, serves as a comparator output.

According to another aspect of the present invention, a comparator circuit has a differential amplifier circuit. Switching means are connected between a differential input terminals of the differential amplifier circuit. A latch circuit is connected to the output of the differential amplifier circuit. A first control means controls the switching means, and a second control means for controls the latch circuit, wherein the differential input terminals serve as an input for the comparator circuit and the output of the latch circuit serves as a comparator output.

After termination of a predetermined period when the switching means is closed and before next closure of the switching means, the control signal for the second control means may be applied to the latch circuit to write the output of the differential amplifier circuit in the latch circuit.

The comparator circuit according to the present invention is suitably applied to an A/D converter circuit, especially of sequential comparison type. Therefore, an A/D converter comprises a conversion means for converting an analog voltage to an analog current, current means for producing a plurality of weighted values of currents, combining means for selectively combining the weighted values of currents, detection means for detecting difference in current value between the analog current and the combined current by the combining means, differential amplifier having a pair of inputs, one of which is supplied with a signal corresponding to the detected difference value, switch means arranged between the pair of inputs of the differential amplifier, and control means for controlling the switch means, wherein the switch means is periodically made conductive to delete potential difference between the pair of inputs through the A/D conversion operation.

The above-mentioned and other features and objects of the present invention will become more apparent by reference to the following description of preferred embodiments of this invention taken in conjunction with the accompanying drawings, wherein:

FIGS. 1 and 2 show examples of prior art comparator circuits, in which a comparison is made between a signal fed from a high impedance signal source and a reference voltage or a signal fed from another signal source.

Figure 1:
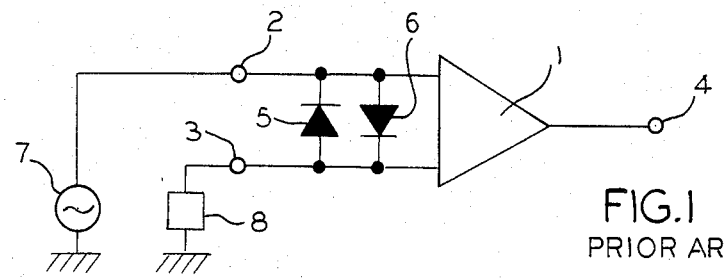
FIG. 1 is a block diagram showing a prior art comparator circuit.

Referring to FIG. 1, diodes 5 and 6 are connected between input terminals 2 and 3 of a differential amplifier 1, in a parallel bidirectional relationship to clamp an amplitude of a differential input. To the input terminal 2 is connected a signal source 7, and to the input terminal 3 is connected a reference voltage source 8. An excessive amplitude of the signal source 7 is clamped by the diodes 5 and 6 with their forward voltages, and thereby a speed-up of the comparison operations can be achieved.

Figure 2:
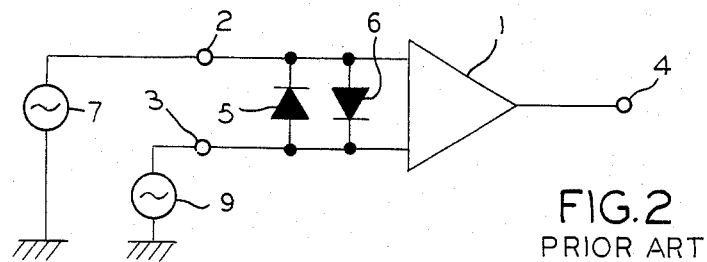
FIG. 2 is a block diagram showing another prior art comparator circuit.

In another known example shown in FIG. 2, in place of the reference voltage source 8, another signal source 9 is connected to the input terminal 3 of the differential amplifier 1. The other component parts which are common to those shown in FIG. 1 are designated by the same reference numerals. In this example also, the diodes 5 and 6 operate as a clamp circuit for suppressing an excessive differential input, and thus contribute to speed-up of the comparison operations. However, such diodes also act as large junction capacitors at the same time, and accordingly, they cause a large time constant at the input end.

Figure 3:
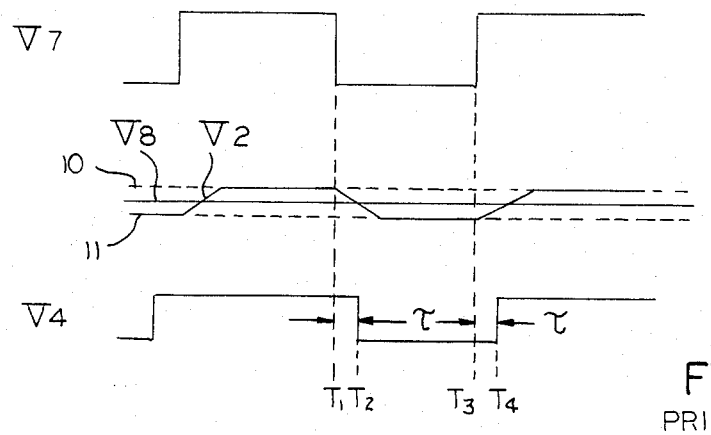
FIG. 3 is a waveform diagram showing the operations of the prior art comparator circuit.

Now the operations of the prior art comparator circuit, shown in FIG. 1, will be explained with reference to FIG. 3. Voltage levels 10 and 11 correspond to clamp voltages for the differential input due to the diodes 5 and 6.

If the input signal $V_7$ of the signal source 7 changes from a high level to a low level at time $T_1$, then the level $V_2$ at the input terminal 2 of the differential amplifier 1 begins to fall from this time point, in accordance with a time constant that is determined by the parasitic capacitance of the diodes 5 and 6 and the impedance of the signal source 7, per se. When the input terminal voltage level $V_2$ becomes lower than the level $V_8$ of the reference signal source 8, after time $T_2$, the output voltage $V_4$ at the output terminal 4 of the comparator is turned from a high level to a low level. Thus a comparison output signal $V_4$ is based on a comparison operation between the input signal $V_7$ and the reference signal $V_8$. As described above, the comparison output $V_4$ is provided as delayed by the period $\tau$ from time $T_1$ to time $T_2$ due to the time constant formed at the input end of the differential amplifier 1. Likewise, when the input signal $V_7$ changes from a low level to a high level at time $T_3$, the input terminal level $V_2$ becomes higher than the reference signal $V_8$ with a delay of the period $\tau$ from time $T_3$ to time $T_4$. Thus the level in the comparison output $V_4$ of the changes from the low level to the high level and also appears with the same delay $\tau$.

As described above, there was a large delay in the comparison operation of the known comparator circuits, so that it was difficult for such comparaor circuits to achieve high speed operation. It is to be noted that if the diodes 5 and 6 clamping are not provided in the input section of the differential amplifier 1, then the amplitude at the input terminal 2 would be approximately equal to the amplitude of the input signal 7. Hence the amount of change in an electric charge at the input terminal 2 is caused by the level change of the input signal $V_7$ and it becomes so large that the comparison operation is further delayed.

Now the comparator circuit according to the present invention will be explained with reference to FIGS. 4 to 6.

Figure 4:
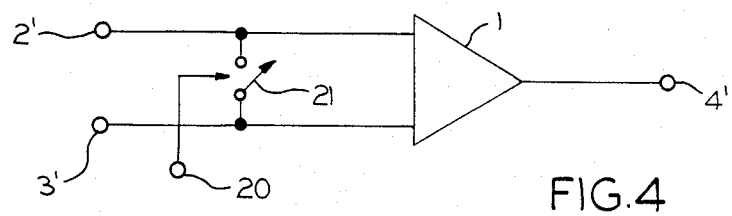
FIG. 4 is a block diagram showing a basic construction of a comparator circuit according to the present invention.

A basic structure of the comparator circuit according to the present invention is illustrated in FIG. 4. An electronic switch 21 is connected between a signal input terminal 2' and a reference signal input terminal 3' of a differential amplifier 1. The opening and closing of this electronic switch 21 is controlled by a control signal $C_{20}$ applied to a control terminal 20. When the electronic switch 21 is closed, it gives a zero input to the differential amplifier 1 in a moment, and thereby immediately removes the level difference between the input terminals 2' and 3'. Subsequently when the electronic switch 21 opens, a level difference appears between the input terminals 2' and 3' at a high speed and without being affected by the parasitic capacitances. In this case, only the negligible time constant caused by the parasitic capacitance of the input wiring would affect the operation. Accordingly, if the gain of the differential amplifier 1 is sufficiently high, then at the moment when the electronic switch 21 opens the output of the differential amplifier 1 shifts to high or low level in response to the differential input.

Figure 5:
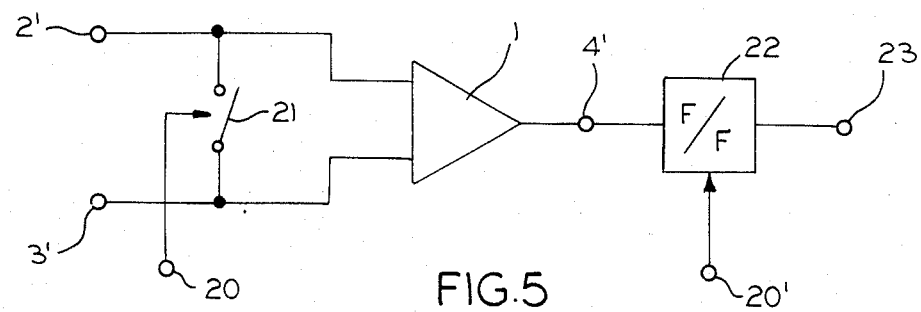
FIG. 5 is a block diagram showing another comparator construction according to the present invention.
Figure 6:
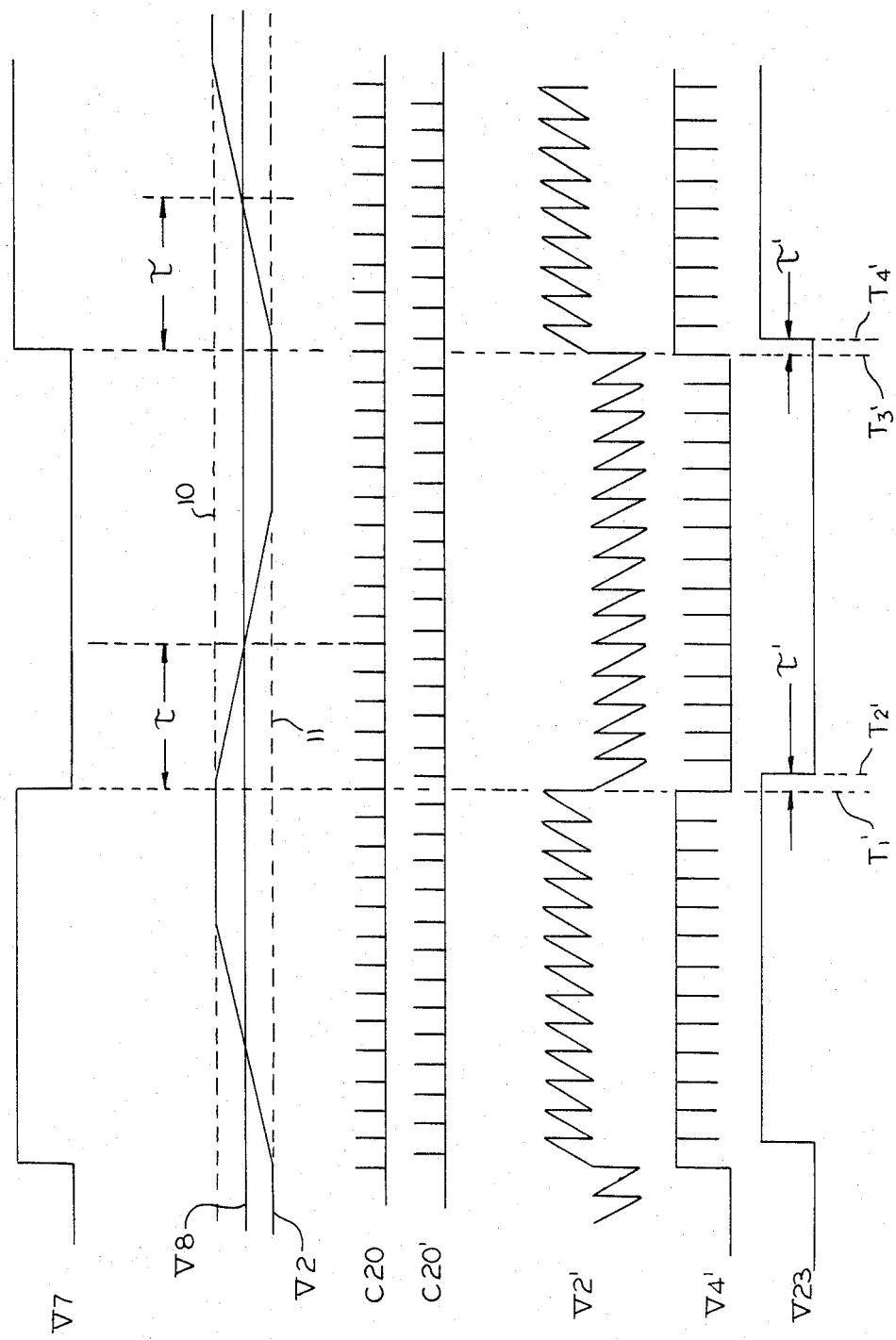
FIG. 6 is a waveform diagram showing the operations of the circuit illustrated in FIG. 5.

Another basic structure of the comparator circuit according to the present invention is illustrated in FIG. 5. In this structure, a latch circuit 22 such as a (flip-flop) is added to the circuit shown in FIG. 4 by being coupled to the output terminal 4' of the differential amplifier 1. A control signal $C_{20'}$ is applied to a control terminal 20' of this latch circuit 22 which in turn responds to the control signal $C_{20'}$ for latching the give an output signal of the data from the differential amplifier 1 to output the comparison data through an output terminal 23. Owing to this latch action for the output data a stabilization of the data against noiser and the like can be achieved. In the operation of this comparator circuit, the control signal 20' brings the latch circuit 22 into a write state after another control signal 20' turned the switch 21 off and the output of the differential amplifier 1 has been established.

The principle of operation of the comparator circuit shown in FIG. 5 will now be explained with reference to FIG. 6. For convenience of contrast to the prior art circuit, the corresponding waveforms in the operation of the prior art comparator circuit illustrated in FIG. 3 are jointly depicted. The common portions to those in FIG. 3 are identified by the same reference numerals and letters.

In the illustrated example, two control signals $C_{20}$ and $C_{20'}$ are in a different phase relationship. The switch 21 (FIG. 5) is periodically closed in response to a first control signal $C_{20}$, to suppress an unnecessary amplitude at the input terminal 2' to which the input signal $V_7$ is applied and to remove an electric charge at the input section, thereby to produce a level $V_{2'}$ at the input terminal 2'. The differential amplifier 1 responds to the differential input as soon as the switch 21 opens to produce an output $V_{4'}$. Subsequently thereto, in response to a second control signal $C_{20'}$ the output $V_{4'}$ of the differential amplifier 1 is written in the latch circuit 22. Thereafter, the output data is latched in the latch circuit 22 until the next write operation. The response time $\tau'$ of the comparator circuit according to the present invention is about one-half of the period of the control signal $C_{20}$. Hence, the present invention can greatly improve the response speed ($\tau'$) of the comparator circuit as compared to the delay time $\tau$ that was inevitable for the prior art comparator circuit.

Figure 7:
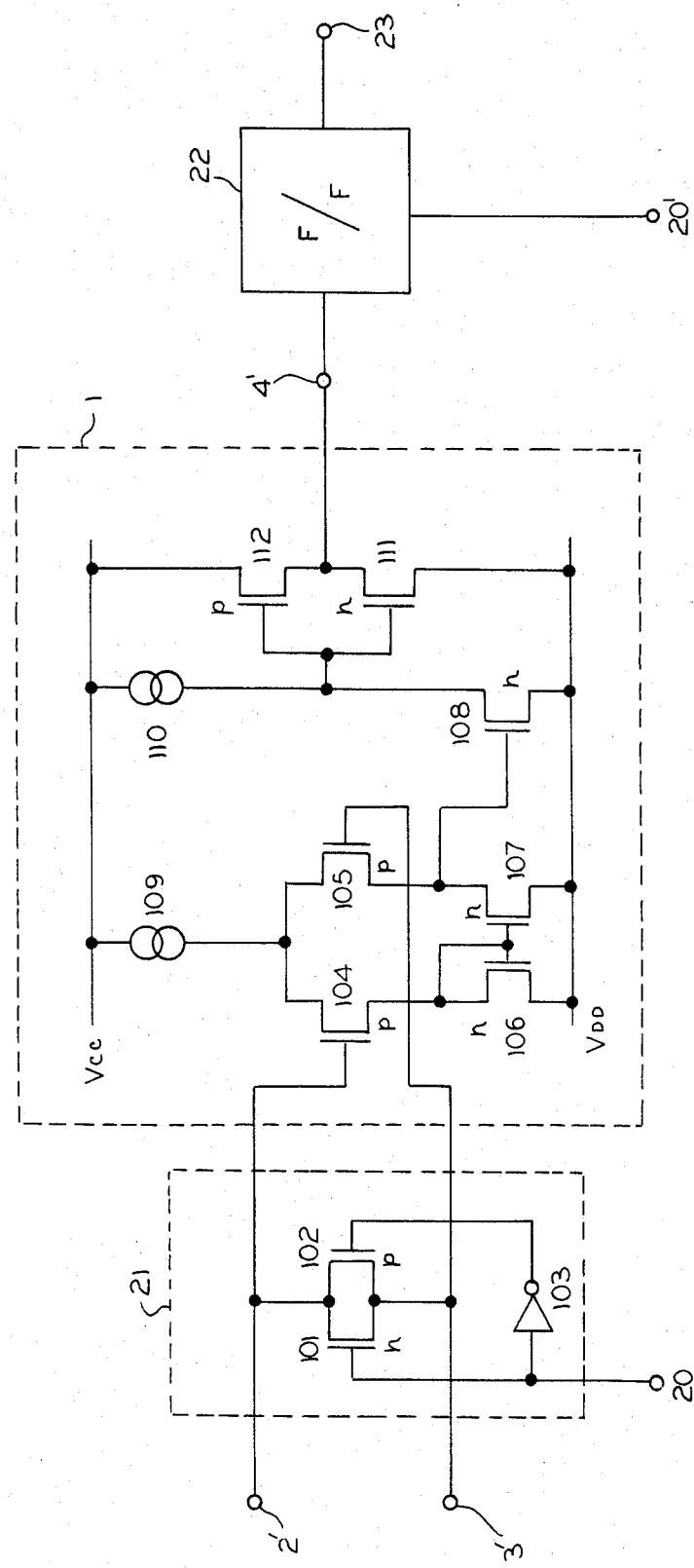
FIG. 7 is a circuit diagram showing one preferred embodiment of the present invention.

Now one preferred embodiment of the comparator circuit according to the present invention, as realized in a monolithic integrated circuit form, will be explained with reference to FIG. 7. The circuit portions common to those shown in FIG. 4 or 5 are designated by the same reference numerals.

An N-channel insulated gate field effect transistor (FET) 101 and a P-channel FET 102 form the electronic switch 21. The differential amplifier 1 is composed of an input stage consisting of P-channel FET's 104 and 105, an active load consisting of n-channel FET's 106 and 107, a driver stage consisting of a FET 108, current sources 109 and 110 for biasing the input stage and the driver stage, and an output inverter stage formed of FET's 111 and 112. The output 4' of the differential amplifier 1 is fed to a well-known flip-flop circuit 22.

As described in detail, the comparator circuit according to the present invention can greatly improve a response speed by making use of a very simple circuit structure, and furthermore, the present invention gives implementation for realizing such a comparator circuit in a monolithic integrated circuit form and thus largely contributes to the developments in this technical field.

Figure 8:
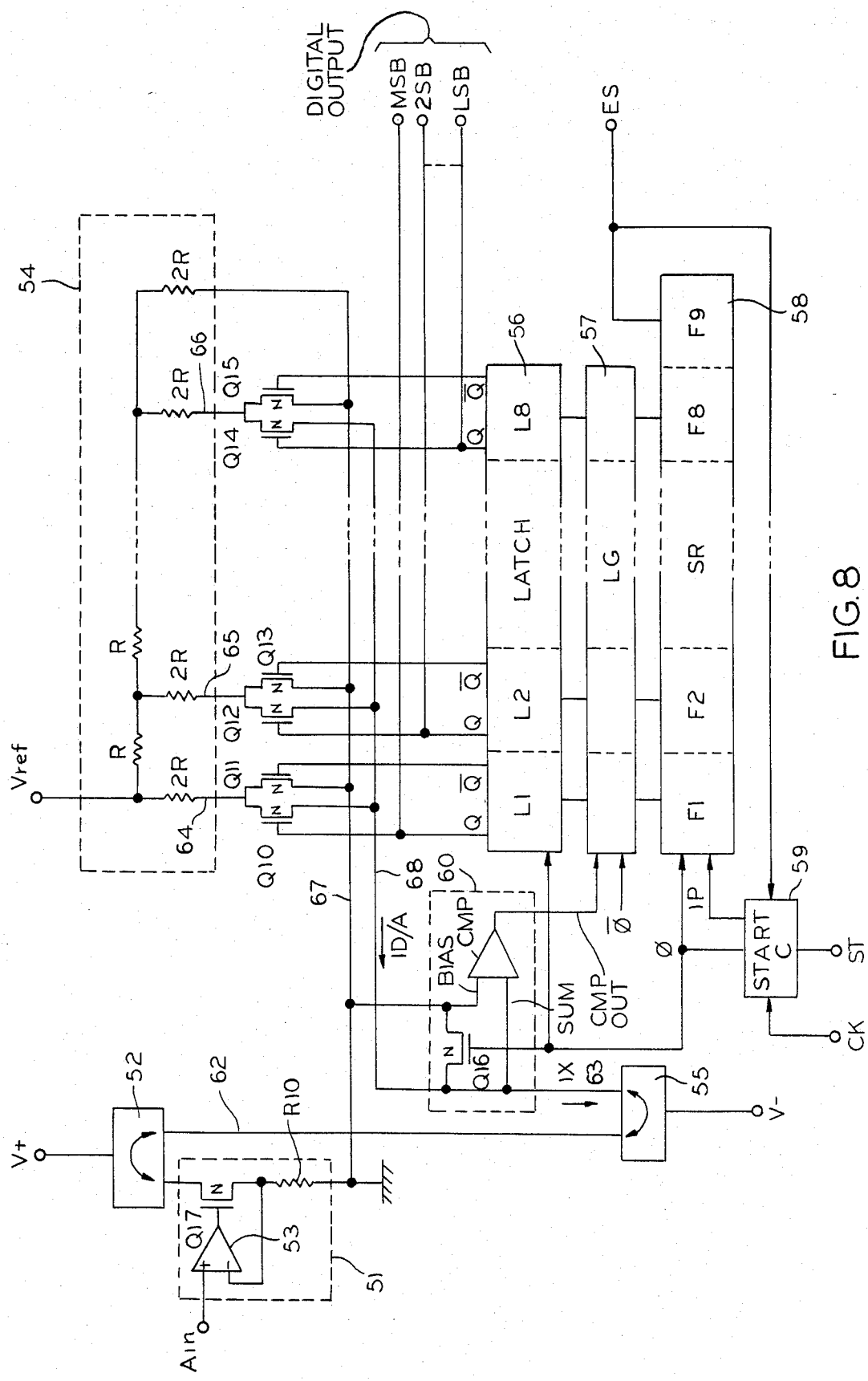
FIG. 8 is a block diagram showing an A/D converter employing the comparator circuit according to the present invention.
Figure 9:
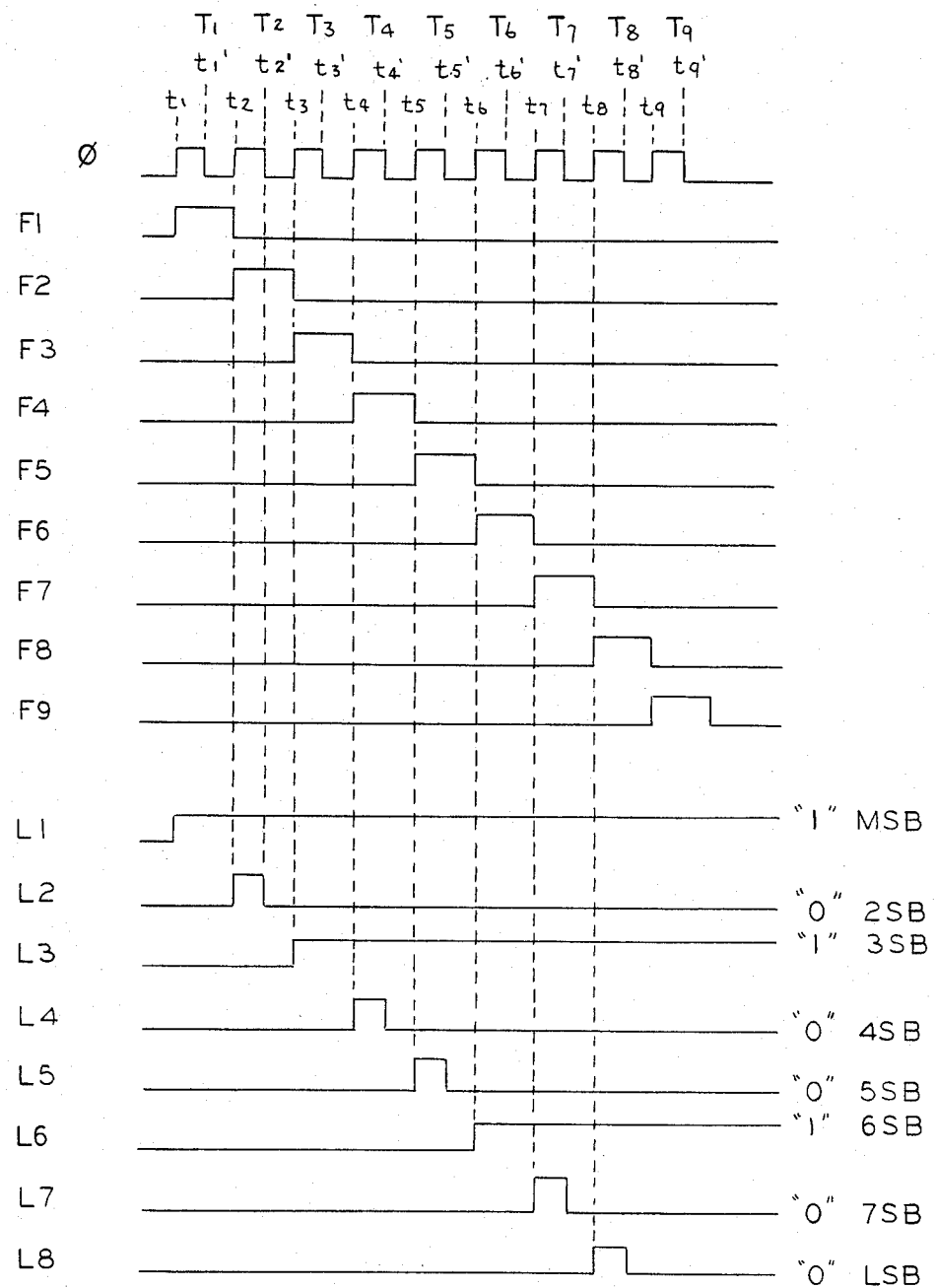
FIG. 9 is a wave form diagram for illustrating operation of logic section of FIG. 8.
Figure 10:
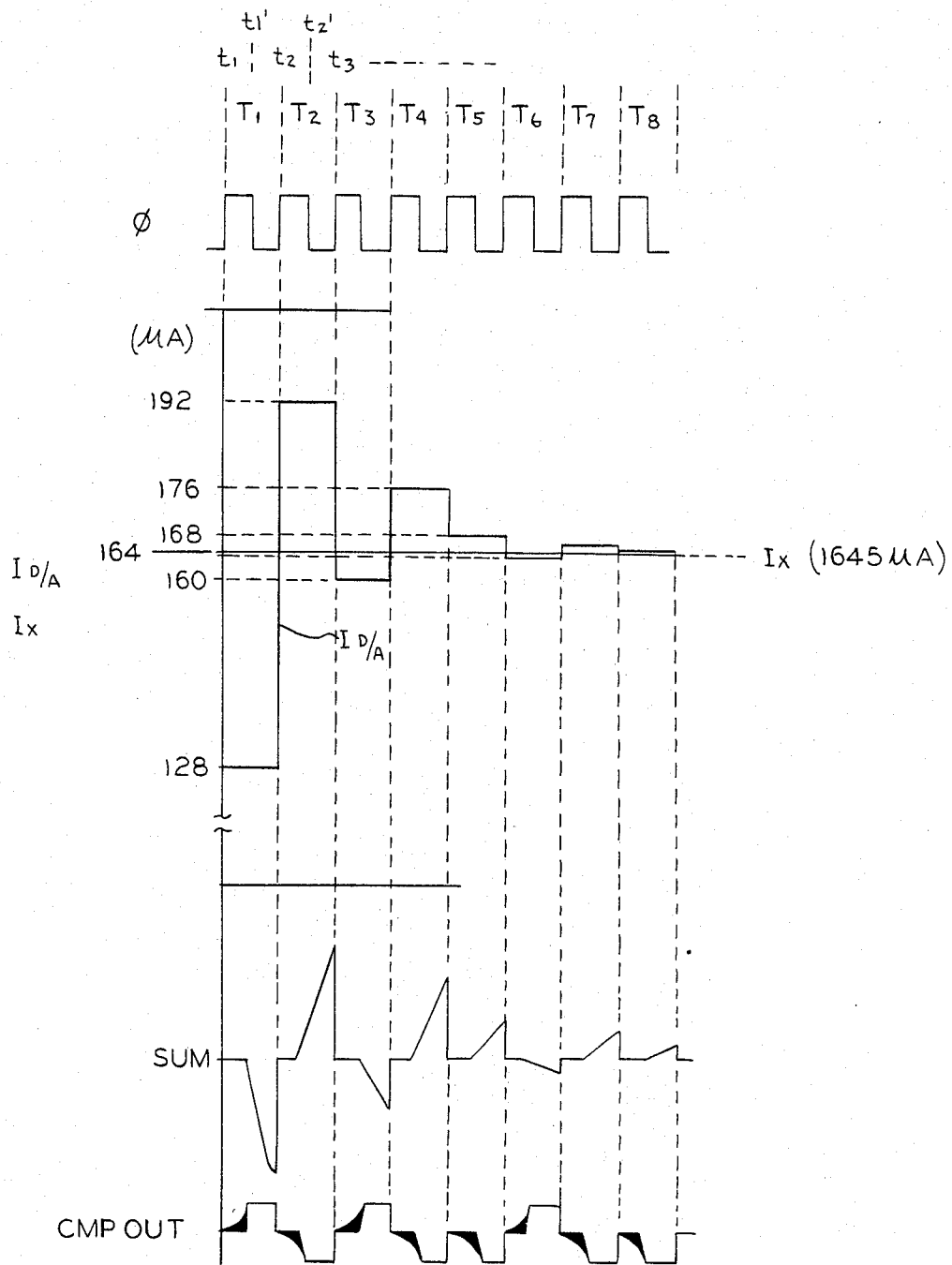
FIG. 10 is a wave form diagram showing conversion operation of the converter of FIG. 8.

With reference to FIGS. 8 to 10, one preferred application example of the present invention will be described. In this example, the comparator according to the present invention is applied to an A/D converter.

In FIG. 8, major parts of the A/D converter comprise a voltage-current converter circuit 51, current mirror circuits 52, 53, a resistor ladder circuit 54, a comparator circuit 60, latch circuits $L_1$ to $L_8$, a logic gate circuit 57 and a shift register 58. The voltage-current converter 51 includes a differential amplifier, an N-channel FET $Q_{17}$ and a resistor $R_{10}$ and responds to a value of analog input voltage applied to a terminal $A_{in}$ to produce a corresponding value at an output line 61. The current mirror circuit 52 responds to the amount of current produced by the voltage-current converter to produce the same amount of current as its output line 62. The current mirror circuit 55 produces the same amount of current that is on the line 62, at an output line 63, thereby to invert a polarity of the current on the line 62. The resistor ladder circuit 54 produces a plurality of weighted values of current at lines 64 to 66, in a known manner. The N-channel FET's $Q_{11}$, $Q_{13}$, - - - and $Q_{15}$ are arranged between the lines 64, 65, - - - and 66 and a common line 67, respectively. The N-channel FET's $Q_{10}$, $Q_{12}$, - - - and $Q_{14}$ are arranged between the lines 64, 65, - - - and 66 and a current summing line 68. True outputs Q of the latch circuits $L_1$ to $L_8$ are applied to gates of FET's $Q_{10}$, $Q_{12}$, - - - $Q_{14}$ and drawn out as a most significant bit (MSB) to least significant bit (LSB) of digital ouputs. Complement outputs $\overline{Q}$ of the latch circuits $L_1$ to $L_8$ are applied to gates of FET's $Q_{11}$, $Q_{13}$, - - - $Q_{15}$. The shift register 58 shifts its data in response to a clock pulse $\phi$. Outputs of the logic gate 57 are enabled by a clock signal $\overline{\phi}$ having a reversed phase relation to the signal $\phi$. The latch circuits $L_1$ to $L_8$ are placed in a write state in response to the clock signal $\phi$ and they hold their data. A start control circuit 59 produces the clock signals $\phi$ and $\overline{\phi}$ and an initial pulse IP of a single shot, in response to a start command ST. In the comparator circuit 60, a N-channel FET $Q_{16}$ is made conductive in response to the clock signal $\phi$ so that the potential difference at differential inputs of a differential amplifier is deleted. In this example, a current difference between the current $I_x$ corresponding to the analog input voltage at the terminal $A_{in}$ and a combined currents $I_{D/A}$ on the line 68 appears at a summing point SUM coupled to one input of the amplifier CMP.

With reference to FIG. 9, operations of the major parts of FIG. 8 will be described.

In this figure, the same reference codes are used to show the wave forms of the corresponding parts. In response to the initial pulse and the clock signal $\phi$, the shift register sequentially shifts the initial pulse from the stage $F_1$ to the stage $F_9$ in accordance with the cycle period of the clock pulse $\phi$ during time periods $T_1$ to $T_9$. The signal derived from the last stage $F_9$ is used as a conversion finish signal ES for resetting the start control circuit 59. Each of the outputs of the latch stages $F_1$ to $F_8$ are applied to the latch circuits $L_1$ to $L_8$ through the logic gate circuit 57 to sequentially pre-set the states of the latch circuit $L_1$ to $L_8$ in response to the high level of the clock signal.

During the first cycle period $T_1$, the transistor $Q_{10}$ is made conductive in response to the high level of the output Q of the latch $L_1$, so that the most significant bit MSB is set. Therefore, the current $I_{D/A}$ is set to the current from the line 64 corresponding to MSB and is compared with the current $I_x$ corresponding to the input analog voltage by the comparator circuit 60, during the period from $t_1$ to $t_{1'}$. In this connection, each first half cycle period of the cycle period T, e.g. $t_1$-$t_{1'}$, the transistor $Q_{16}$ is made conductive so that the differential input SUM of the amplifier is made substantially equal to the potential at the other inputs BIAS, i.e. ground potential. A comparison result derived from the comparator circuit 60 is fed back to the latch circuit $L_1$ through the logic gate circuit 57. The latch circuit $L_1$ latches the comparison result of the cycle period $T_1$ in response to a rise of the clock signal $\phi$ at a time point $t_2$ and holds it from the cycle period $T_2$. In FIG. 9, conversion result "1 0 1 0 0 1 0 0" is indicated as one example.

With reference to FIG. 10, one detailed operation of the circuit in FIG. 8 will be described. In the following description, it is assumed that full scale current of the 8-bit D/A converter of FIG. 8 is 256 μA. At the cycle period $T_1$, the latch circuit $L_1$ is set to establish MSB wherein the value of the current $I_{D/A}$ is 128 μA. Now, the current $I_x$ corresponding to the analog input is assumed to be 164.5 μA. Then, at a second half cycle period i.e. the period of the low level of $\phi$ during the period $T_1$, the level of the summing point SUM is rapidly lowered, based on a relation $I_{D/A} > I_x$ so that the output CMP OUT of the comparator circuit 60 changes to "1". The output CMPOUT of "1" is then latched by the latch circuit $L_1$ at a rise of the signal $\phi$ ($t_2$) and the digital data MSB of "1" is established as one digit of the digital output. Then, at the succeeding period $T_2$, the second stage $F_2$ of the shift register 58 changes to a "1" level and the transistor $Q_{12}$ is made conductive so that second significant bit of current at the line 65 is added to the current $I_{D/A}$. Therefore, the current $I_{D/A} = (128+64) \mu A = 192$ μA is produced at the line 68. In this case, there is a relationship of $I_x < I_{D/A}$. Then, at the second half period $t_{2'}$-$t_3$, the current at the summing point SUM is rapidly increased so that the output CMP OUT changes to "0". This CMP OUT of "0" is latched by the latch circuit $L_2$. Thus, the second significant bit (2SB) is set at "0".

Then, a similar operation is effected on the third significant bit (3SB) to the least significant bit (LSB) in synchronous with the timing signal $\phi$. Through these comparison operation, there is a case in which a difference in value between the current $I_x$ and the $I_{D/A}$ becomes remarkably small. In the example of FIG. 10, during the period $T_6$, the difference between $I_x$ and $I_{D/A}$ takes a small value of 0.5 μA.

In this connection, if the value of the current is assumed to be 191.9 μA, such a case appears at the period $T_2$ with the difference current of 0.1 μA. In this case, if the prior art comparator of FIG. 1 is used for this purpose, the level of the summing point SUM (at a termination of the period $T_1$) is about $-600$ mV. Stray capacitance at the summing point SUM is assumed to be 10 pF; then time constant T becomes as follows:

$$T = V \cdot (C/I) = 0.6(V) \times (10\ pF/0.1\ \mu A) = 60\ \mu S$$

Therefore, the prior art comparator requires a time period of 60 μS for obtaining the comparison result of the difference of 0.1 μA.

While the comparator circuit 60 according to the present invention achieves the comparison operation with a period no more than 1 μS provided that the conductive resistance of the transistor $Q_{16}$, an offset voltage of the comparator 60 and a gain of the amplifier CMP are respectively 100 Ω, 5 mV and 80 dB. Therefore, high speed of one hundred times of the prior art comparator can be obtained by the comparator of the invention.

Now, it is noted that the present invention is not limited to the above described embodiments and any modifications and different embodiments are included in the invention.

I claim:

1. A comparator circuit comprising a differential amplifier circuit means having a pair of input terminals, means for supplying a fixed potential to a first of said input terminals, means for supplying to a second of said input terminals an input potential which maintains a level that is different from said fixed potential during at least a comparison period of time, short circuiting means connected between said first and second input terminals for operatively completing a short circuit therebetween prior to the start of said comparison period, control means for periodically driving said short circuiting means to complete and remove said short circuit a plurality of times during said comparison period, said short circuiting means including a field effect transistor coupled directly between said first and second input terminals and being driven responsive to said control means to periodically short circuit and remove said short circuit between said input terminals, whereby a potential at said second input terminal is periodically made equal to said fixed potential every time said short circuiting means is driven into a short circuiting condition during said comparison period, and comparison means responsive to differences between said input potential and said fixed potential when said short circuit is removed during said comparison period, whereby a comparison result is indicated every time said short circuiting means is driven to remove said short circuit.

2. The circuit according to claim 1, further comprising a latch circuit for storing said comparison result.

3. The circuit according to claim 2, wherein said control means includes means for supplying said short circuiting means circuit with a first clock signal.

4. The circuit according to claim 3, further comprising means for providing said latch circuit with a second clock signal as a write control signal, the phase of said second clock signal being different from the phase of said first clock signal.

5. The circuit according to claim 3, wherein said short circuiting means includes an N-channel field effect transistor and a P-channel field effect transistor which are connected in parallel.

6. A comparator circuit comprising a differential amplifier means having a first and second differential input terminals, means for supplying a fixed potential to said first input terminal, means for supplying a first variable current and a second variable current to said second input terminal during a predetermined comparison period, a switching field effect transistor having a source-drain path coupled directly between said first and second input terminals, means for initially closing and thereafter repeatedly opening and closing the path through said switching field effect transistor a plurality of times during said determined comparison period, said switching field effect transistor making a potential of said second input terminal equal to said fixed potential every time said path is closed during said predetermined comparison period, the output of said differential amplifier circuit means representing a comparison output every time said path is opened during said predetermined period.

7. The comparator circuit of claim 6 which further comprises flip-flop circuit means for writing the output of said differential amplifier means.

8. The circuit according to claim 6, further comprising a latch circuit for periodically storing said output signal.

9. A comparator circuit comprising a first input terminal, a second input terminal, a first voltage line, a second voltage line, a differential amplifier means including a first field effect transistor of one conductivity type having a gate connected to said first input terminal, a second field effect transistor of said one conductivity type having a gate connected to said second input terminal, a first node, a current source coupled between said first node and said second voltage line, a third and a fourth field effect transistors of the opposite conductivity type, said first and third field effect transistors being connected in series between said first node and said first voltage line, said second and fourth field effect transistors being connected in series between said first node and said first voltage line, gates of said third and fourth field effect transistors being connected to the junction of said first and third field effect transistors, a fifth and sixth field effect transistors of one and the opposite conductivity types coupled in parallel with each other and connected between said first and second input terminals, means for supplying the gate of said fifth field effect transistor with a first clock signal, means for supplying the gate of said sixth field effect transistor with a second clock signal of a phase which is opposite to the phase to said first clock signal, output means responsive to a potential at the junction between said second and fourth field effect transistors for producing an output signal, said output means including a first series circuit of a seventh field effect transistor and a current source means connected between said first voltage line and said second voltage line, a second series circuit of an eighth and a ninth field effect transistors of the one and the opposite conductivity types, means for connecting the gates of said eighth and ninth field effect transistors in common and to the intermediary junction of said first series circuit, means for connecting the gate of said seventh field effect transistor to the junction of said second and fourth field effect transistors, and means for deriving said output signal from an intermediary junction of said second series circuit.

* * * * *